United States Patent
Bartl

(10) Patent No.: US 6,801,757 B2
(45) Date of Patent: Oct. 5, 2004

(54) CIRCUIT CONFIGURATION FOR MATCHING AN AMPLIFIER TO A RADIO-FREQUENCY LINE, AND USE OF THE CIRCUIT CONFIGURATION

(75) Inventor: Thomas Bartl, San Diego, CA (US)

(73) Assignee: Infineon Technologies AG, Munich (DE)

(*) Notice: Subject to any disclaimer, the term of this patent is extended or adjusted under 35 U.S.C. 154(b) by 443 days.

(21) Appl. No.: 10/026,075

(22) Filed: Dec. 24, 2001

(65) Prior Publication Data

US 2002/0098808 A1 Jul. 25, 2002

Related U.S. Application Data

(63) Continuation of application No. PCT/DE00/01758, filed on May 30, 2000.

(30) Foreign Application Priority Data

Jun. 24, 1999 (DE) .......................................... 199 28 942

(51) Int. Cl.$^7$ ................................................ A04B 1/46
(52) U.S. Cl. .......................... 455/80; 455/107; 455/250; 330/145; 330/129; 330/130
(58) Field of Search ................................. 330/145, 129, 330/130; 455/80, 107, 280

(56) References Cited

FOREIGN PATENT DOCUMENTS

JP 0920128 A2 * 6/1999

* cited by examiner

*Primary Examiner*—Erika Gary
*Assistant Examiner*—David Q Nguyen
(74) *Attorney, Agent, or Firm*—Laurence A. Greenberg; Werner H. Stemer; Gregory L. Mayback

(57) ABSTRACT

A circuit for matching an amplifier to a radio-frequency line is described. In order to minimize the number of components required for matching the amplifier to different frequency bands, the circuit has a first capacitance for outputting the negative half-cycle of the transmission signal, which is rectified by a diode and is stored in a second capacitance. The stored negative voltage is, if required, fed back via two resistors and an inductance to a further diode.

6 Claims, 2 Drawing Sheets

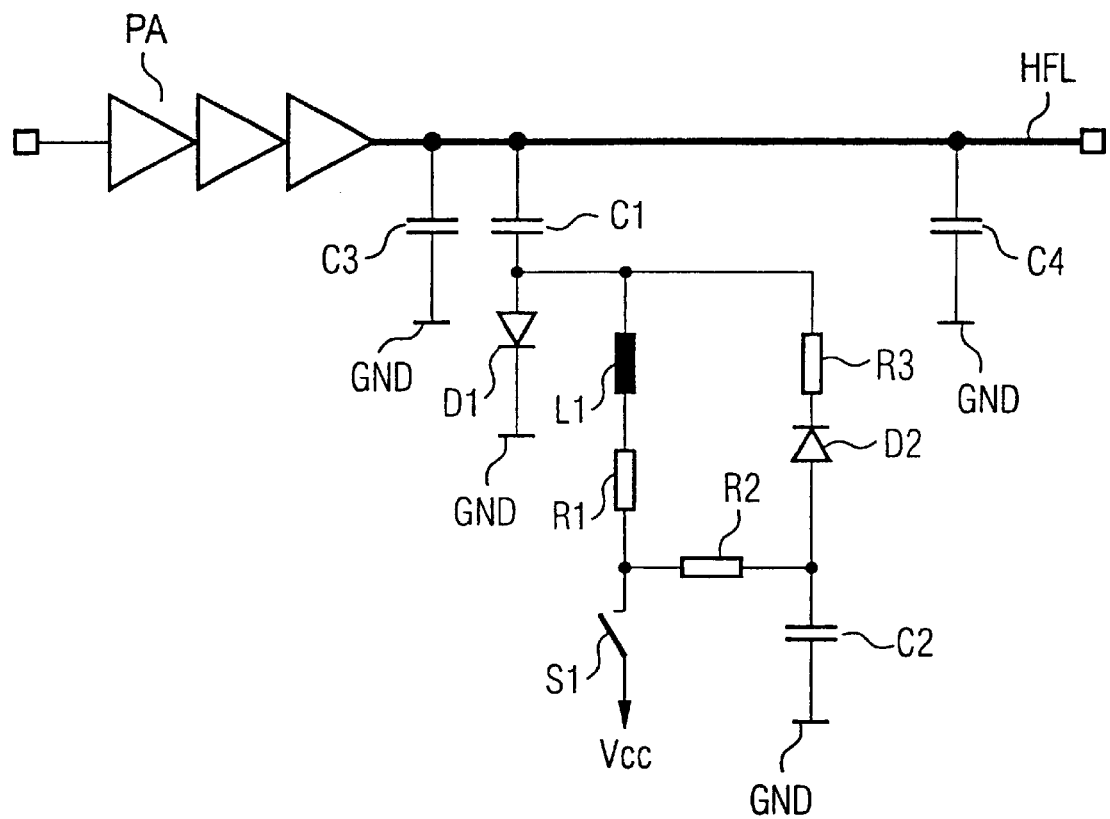

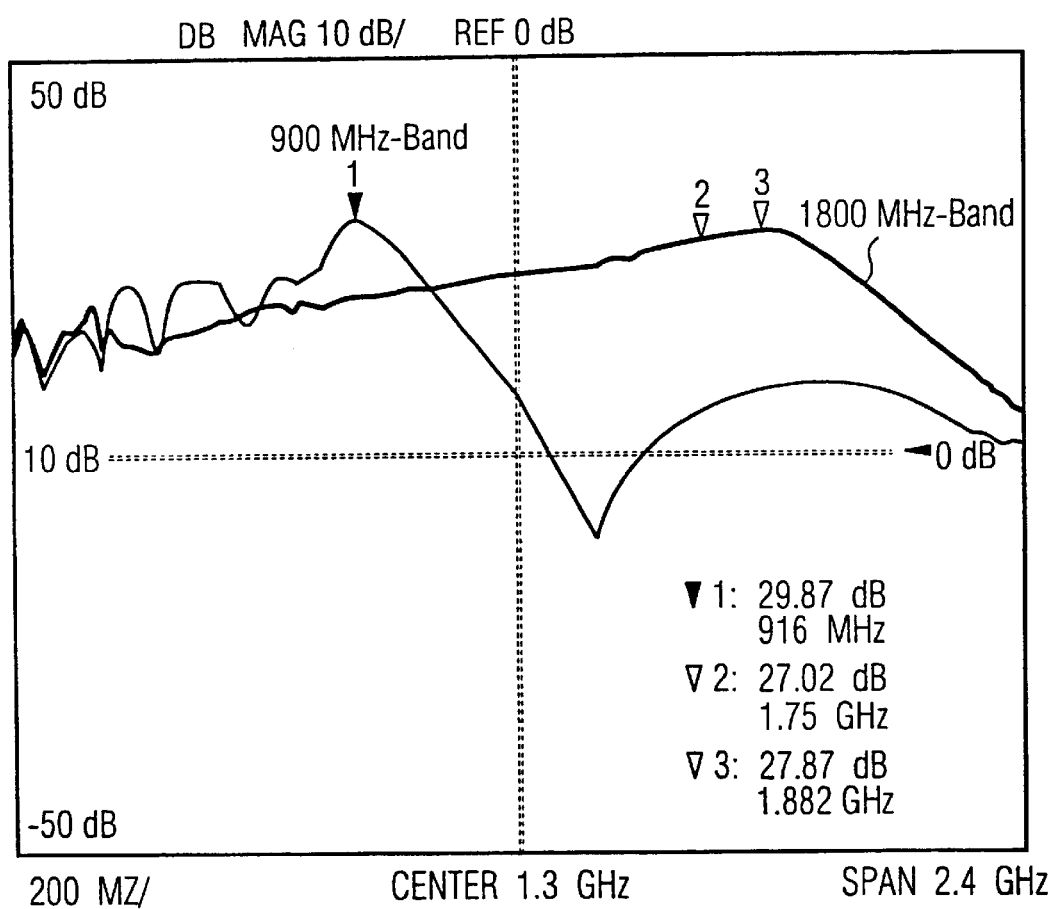

CIRCUIT CONFIGURATION FOR MATCHING AN AMPLIFIER TO A RADIO-FREQUENCY LINE, AND USE OF THE CIRCUIT CONFIGURATION

CROSS-REFERENCE TO RELATED APPLICATION

This application is a continuation of copending International Application PCT/DE00/01758, filed May 30, 2000, which designated the United States.

BACKGROUND OF THE INVENTION

Field of the Invention

The invention relates to a circuit configuration for matching an output impedance of an amplifier to a radio-frequency line, and to use of the circuit configuration. The circuit configuration is used for matching single-way power amplifiers for dual-band mobile telephones. In one-way power amplifiers, the matching to the 900 MHz (GSM, D1, D2 network) or 1800 MHz band is carried out by switching the matching circuit.

In the past, an external negative voltage source was disadvantageously required in addition to a positive voltage source for switching the matching circuit in one-way power amplifiers.

Dual-band radio telephones with two-way amplifiers are costly, due to the necessity to duplicate the configuration of the transmission paths as far as the antenna.

Various circuit variants for a signal input circuit using a PIN diode are disclosed in German Patent DE 32 10 453 C2. The PIN diode is in each case connected to the signal input via reactive elements. The other connection of the diode may be connected via a capacitor to ground. The signal is passed via an inductance to an amplifier element, which is in the form of a transistor.

SUMMARY OF THE INVENTION

It is accordingly an object of the invention to provide a circuit configuration for matching an amplifier to a radio-frequency line that overcomes the above-mentioned disadvantages of the prior art devices of this general type, which not only has just one transmission path for two different frequency bands, but also does not require any external negative voltage source.

With the foregoing and other objects in view there is provided, in accordance with the invention, a circuit configuration for matching an amplifier to a radio-frequency line. The circuit configuration contains a first diode having a first terminal and a second terminal to be connected to a first potential, an inductor having a first terminal and a second terminal, and a first capacitance having a first terminal connected to the radio-frequency line and a second terminal connected to the first terminal of the first diode and to the first terminal of the inductance. A second diode is provided and has a first terminal coupled to the first capacitance and a second terminal. A first resistor is provided and has a first terminal connected to the second terminal of the inductance and a second terminal. A second resistor has a first terminal connected to the second terminal of the first resistor and a second terminal. A switching device has a first terminal connected to the second terminal of the first resistor and to the first terminal of the second resistor. The switching device has a second terminal to be connected to a second potential. A second capacitance has a first terminal connected to the second terminal of the second resistor and to the second terminal of the second diode. The second capacitance has a second terminal to be connected to the first potential.

Thus, for example, it is advantageous to connect a third resistor between the second diode and the inductance. This makes it possible to limit the current flowing through the second diode.

In accordance with an added feature of the invention, the first diode is a PIN diode, the second diode is a Schottky diode, and the switching device is an audio frequency transistor.

The circuit configuration is ideally used in combination with a dual-band radio (mobile) telephone having a transmission path which can be used for different frequency bands. The circuit configuration matches an amplifier to the different frequency bands.

Other features which are considered as characteristic for the invention are set forth in the appended claims.

Although the invention is illustrated and described herein as embodied in a circuit configuration for matching an amplifier to a radio-frequency line, and use of the circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a circuit for matching an amplifier to a radio-frequency line according to the invention; and FIG. 2 is a graph showing a transmission response of the circuit for the 900 MHz and 1800 MHz bands.

DESCRIPTION OF THE PREFERRED EMBODIMENTS

Referring now to the figures of the drawing in detail and first, particularly, to FIG. 1 thereof, there is shown a circuit for matching an amplifier PA to a radio-frequency line HFL. The circuit has a first capacitance C1, which is connected to the radio-frequency line HFL, to an anode of a first diode D1, to a connection of an inductance L1, and via a resistor R3 to a cathode of a second diode D2. A cathode of the first diode D1 is connected to a first potential GND. The second connection of the inductance L1 is connected via a first resistor R1 both to a second resistor R2 and, via a device S1 for switching, to a second potential Vcc. An anode of the second diode D2 is connected to the second resistor R2 and, via a second capacitance C2, to the first potential GND. A third capacitance C3 in the vicinity of the amplifier PA is connected first to the radio-frequency line HFL and second to the first potential GND. A fourth capacitance C4 which, viewed from the amplifier PA, is located behind the first capacitance C1, is connected first to the radio-frequency line HFL and second to the first potential GND.

The first diode D1 is advantageously a PIN diode, and the second diode D2 is a Schottky diode. An audio frequency transistor is used as the device S1 for switching. The radio-frequency line HFL is a 50 ohm line, which is preferably in the form of a microstrip line.

In the situation where the aim is matching to the 900 MHz band (GSM, D1, D2 network), the PIN diode D1 has a current impressed on it which is produced by closing the switch S1, that is to say the node of the resistors R1 and R2 is at the second potential Vcc. The impedance of the PIN diode D1 is thus very low. The magnitude of the current flowing through the inductance L1 and the diode D1 is governed by the resistor R1. The inductance L1 is used as a low-pass filter for shielding against radio-frequency signals. Since the diode D1 is forward-biased, the capacitor C1 is approximately at the first potential GND.

If the amplifier PA is intended to operate in the 1800 MHz band, the impedance of the PIN diode D1 is made high for power matching, by applying a sufficiently high negative voltage, with respect to the first potential GND, to the anode of the diode D1. This is achieved by opening the switch S1, so that the second potential Vcc is no longer applied to the node of the resistors R1 and R2, so that the negative half-cycle of the transmission signal, which is stored in the capacitor C2, is applied via the resistor R2, the resistor R1 and the inductance L1 to the node between the capacitor C1 and the diode D1. The capacitor C2 has previously been charged via the capacitor C1, the resistor R3 and the diode D2 during the negative half-cycle of the transmission signal. The resistor R3 must in this case be chosen to be sufficiently large that the radio-frequency losses can be kept low. The resistor R2 must have a high resistance. During the positive half-cycle of the transmission signal, a limited discharge process can take place via the resistors R2 and R1, the inductance L1 and the diode D1.

The resistor R3 is used for current limiting.

The RF voltage is output via the capacitor C1, which is also referred to as a matching capacitor, and is rectified by the Schottky diode D2 and the capacitor C2. The negative stored voltage is fed back to the diode D1.

When the circuit is operated at 900 MHz, then the resistor R1 governs the current flowing through the diode D1.

The graph shown in FIG. 2 illustrates the transmission response of the circuit shown in FIG. 1 in the 900 MHz band and in the 1.8 MHz band. The abscissa of the graph shows the frequency in 200 MHz steps, and the ordinate shows the attenuation in 10 dB steps. It can be seen from the graph that the transmission signal is optimally matched for operation in the 900 MHz band. It can also be seen from the graph that the transmission signal is optimally matched for operation in the 1.8 GHz band.

The 1800 MHz band is often also referred to as the PCN or GSM 1800 band.

The circuit according to the invention advantageously does not require any additional negative voltage generator, which has a positive effect, especially in circuits using heterobipolar transistors (HBTs).

I claim:

1. A circuit configuration for matching an amplifier to a radio-frequency line, the circuit configuration comprising:
   a first diode having a first terminal and a second terminal to be connected to a first potential;
   an inductor having a first terminal and a second terminal;
   a first capacitance having a first terminal connected to the radio-frequency line and a second terminal connected to said first terminal of said first diode and to said first terminal of said inductance;
   a second diode having a first terminal coupled to said first capacitance and a second terminal;
   a first resistor having a first terminal connected to said second terminal of said inductance and a second terminal;
   a second resistor having a first terminal connected to said second terminal of said first resistor and a second terminal;
   a switching device having a first terminal connected to said second terminal of said first resistor and to said first terminal of said second resistor, said switching device having a second terminal to be connected to a second potential; and
   a second capacitance having a first terminal connected to said second terminal of said second resistor and to said second terminal of said second diode, said second capacitance having a second terminal to be connected to the first potential.

2. The circuit configuration according to claim 1, wherein said first diode is a PIN diode.

3. The circuit configuration according to claim 1, wherein said second diode is a Schottky diode.

4. The circuit configuration according to claim 1, wherein said switching device is an audio frequency transistor.

5. The circuit configuration according to claim 1, including a third resistor having a first terminal connected to said first terminal of said inductance and a second terminal connected to said first terminal of said second diode.

6. In combination with a dual-band radio telephone having a transmission path which can be used for different frequency bands, a circuit configuration for matching an amplifier to the different frequency bands, the circuit configuration comprising:
   a first diode having a first terminal and a second terminal to be connected to a first potential;
   an inductor having a first terminal and a second terminal;
   a first capacitance having a first terminal connected to the radio-frequency line and a second terminal connected to said first terminal of said first diode and to said first terminal of said inductance;
   a second diode having a first terminal coupled to said first capacitance and a second terminal;
   a first resistor having a first terminal connected to said second terminal of said inductance and a second terminal;
   a second resistor having a first terminal connected to said second terminal of said first resistor and a second terminal;
   a switching device having a first terminal connected to said second terminal of said first resistor and to said first terminal of said second resistor, said switching device having a second terminal to be connected to a second potential; and
   a second capacitance having a first terminal connected to said second terminal of said second resistor and to said second terminal of said second diode, said second capacitance having a second terminal to be connected to the first potential.

* * * * *